United States Patent [19]

Suzuki et al.

[11] Patent Number: 4,969,104

[45] Date of Patent: Nov. 6, 1990

[54] DIAGNOSIS ARRANGEMENT FOR VEHICLE ENGINE CONTROLLER

[75] Inventors: Fujiyuki Suzuki; Akira Osada, both of Shizuoka, Japan

[73] Assignee: Suzuki Jidosha Kogyo Kabushiki Kaisha, Shizuoka, Japan

[21] Appl. No.: 464,710

[22] Filed: Jan. 12, 1990

Related U.S. Application Data

[63] Continuation of Ser. No. 279,550, Dec. 2, 1988, abandoned.

[30] Foreign Application Priority Data

Dec. 10, 1987 [JP] Japan .................. 62-310955

[51] Int. Cl.$^5$ .................. G06F 15/20; F02M 25/06
[52] U.S. Cl. .................. 364/431.06; 364/431.01; 364/424.03; 123/571; 73/116; 73/117.3
[58] Field of Search .................. 364/431.06, 431.05, 364/431.04, 431.03, 431.01, 424.03, 550, 551.01, 570; 123/571, 568, 479, 480; 73/116, 117.3

[56] References Cited

U.S. PATENT DOCUMENTS

| | | | |
|---|---|---|---|
| 4,267,569 | 5/1981 | Baumann et al. | 364/431.01 |
| 4,402,217 | 9/1983 | Higashiyama | 73/117.3 |
| 4,410,938 | 10/1983 | Higashiyama | 364/431.04 |
| 4,521,885 | 6/1985 | Melocik et al. | 364/424.03 |
| 4,694,408 | 9/1987 | Zaleski | 371/20 X |
| 4,709,341 | 11/1987 | Matsuda | 364/550 |
| 4,715,348 | 12/1987 | Kobayashi et al. | 364/431.06 |

Primary Examiner—Parshotam S. Lall
Assistant Examiner—V. N. Trans
Attorney, Agent, or Firm—Flynn, Thiel, Boutell & Tanis

[57] ABSTRACT

A diagnosis arrangement for a vehicle engine controller includes a control arrangement which examines a signal identifying the activation of an auxiliary control system of the engine and which determines whether the auxiliary engine control system, which includes a device controlled by a particular control program selected from a plurality of programs stored therein, is actuated in a manner corresponding to the selected control program.

8 Claims, 3 Drawing Sheets

DIAGNOSIS ARRANGEMENT FOR VEHICLE ENGINE CONTROLLER

This application is a continuation of U.S. Ser. No. 279,550, filed Dec. 2, 1988.

FIELD OF THE INVENTION

The present invention relates to a diagnosis arrangement for a vehicle engine controller, in which the action of an auxiliary engine control system, which includes an arrangement controlled by a control program selected from a plurality of control programs stored therein, is inspected based on a check signal taken therefrom as an examining factor, in order to see whether it is operating in a manner corresponding to the selected control program, so that the control arrangement can be utilized commonly for the distinct control programs and can be prevented from being used in a mismatch.

BACKGROUND OF THE INVENTION

It is known that an internal combustion engine installed in an automotive vehicle has a variety of devices for ensuring proper operating performance. For example, it typically includes a fuel jet device for supplying a jet of fuel to the engine, an idling-up device for adjusting the number of revolutions to a slightly higher than normal setting during idling in order to stabilize the idling motion in the engine, and an EGR mechanism for reducing NOx contained in the exhaust fumes. These devices are typically controlled by a controller (control circuit) such as a microcomputer.

Such controller installed in an engine for controlling various devices is disclosed, for example, in the Japanese Laid-open Patent Sho No. 60-219432. What is shown in this publication contains, within the controller, a computer for controlling the motor of the idle speed adjusting device and actuators of other devices, and a dignosis circuit for supporting the action in the event of failure of the computer. This computer in the controller turns on the main relay for the controller when the ignition switch is turned on to supply electric power, and controls to operate the motor and actuator according to an incorporated program, and initializes the motor and actuator and turns off the main relay when the ignition switch is turned off. The diagnosis circuit in the controller is intended to avoid the risk of unexpected onset of accident if the computer goes wrong, and the main relay is not turned off when the ignition switch is turned off, and the power source is continuously supplied, and the motor and actuator are not initialized. In such a case, this diagnosis circuit securely turns off the main relay when the ignition switch is turned off to shut off power supply to the controller, thereby initializing the motor and actuator, so that secure control is guaranteed.

The controller disclosed in this cited publication controls various devices according to an incorporated program. However, as the program for controlling the engine, if there are two programs, for example, program A not considering the action of an engine auxiliary unit such as EGR mechanism, and program B considering the action of EGR mechanism (the inputs and outputs other than EGR are common, and the action logics are separate), individual controllers are necessary for programs A and B, and therefore when assembling the controller into the engine, the control becomes very complicated. Besides, considering the possibility of mismatching of the controllers, diagnostic detection means for detecting wrong matching is needed in each controller, and if this means is not provided, mismatching may lead to worsening of emission.

A primary object of the present invention is to provide a diagnosis arrangement for a vehicle engine controller in which the action of an auxiliary engine control system, which includes an arrangement controlled by a control program selected from a plurality of control programs stored therein, is inspected based on a check signal taken therefrom, to see whether it is operating in a manner corresponding to the selected control program.

SUMMARY OF THE INVENTION

According to the present invention, a control arrangement checks whether the auxiliary engine control system, which includes an arrangement controlled by a particular control program selected from several programs stored therein, is actuated in a manner corresponding to the selected program.

Thus, there is no need of having a plurality of control arrangements for distinct control programs, and a single control arrangement can be utilized for multiple applications and can still be kept from being used in a mismatch.

BRIEF DESCRIPTION OF THE DRAWINGS

FIGS. 1 to 4 illustrate one embodiment of the present invention, in which:

FIG. 1 is a diagrammatic view of the complete arrangement of an internal combustion engine;

FIG. 2 is a circuit diagram of a control circuit which is part of the arrangement of FIG. 1;

FIG. 3 is a graph showing the characteristic of a thermistor which is a component of the arrangement of FIG. 1; and FIG. 4 is a flow chart showing a procedure carried out by the circuit of FIG. 2.

Figure 1:
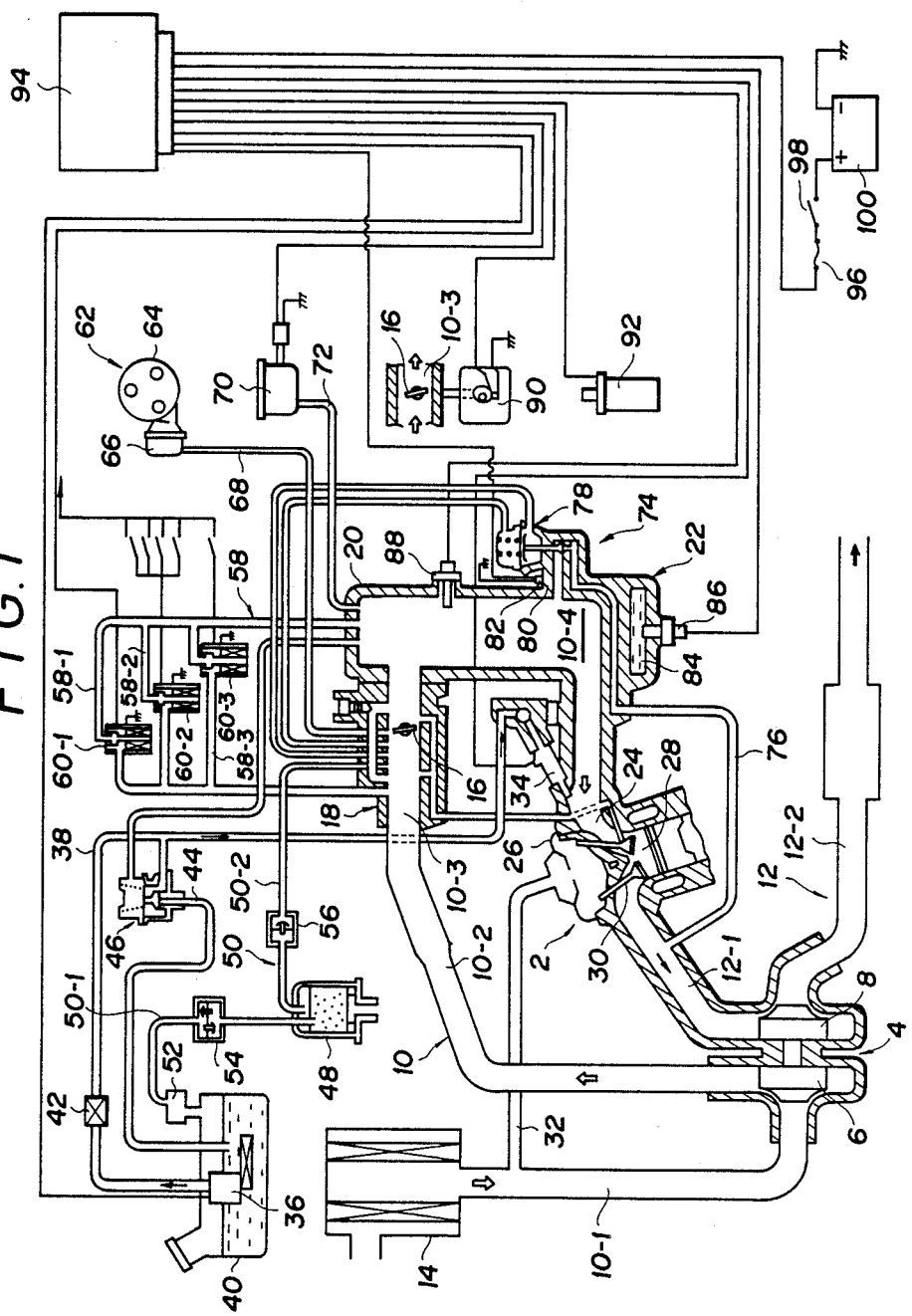

In the drawings, reference numeral 2 designates an engine, 4 a charger, 10 an air intaking passage, 12 an exhaust passage, 16 a suction throttle valve, 22 a suction manifold, 34 a fuel jet valve, 62 an ignition device, 74 an EGR mechanism, 78 an EGR valve, 80 an EGR passage wall, 82 a thermistor, 86 a water temperature sensor, 94 a control circuit, 102 a selector switch, and 104 a check lamp.

DETAILED DESCRIPTION

One embodiment of the present invention will be described in detail with reference to the drawings.

As shown in FIGS. 1 to 4, the embodiment includes an engine 2, a charger 4 which includes a compressor 6 and an exhaust turbine 8, an air intaking passage 10, and an exhaust passage 12. The charger 4 is connected at the upstream side of the compressor 6 to an air cleaner 14 by a first air intaking passage portion 10-1 and at the downstream side of the compressor 6 by a second air intaking passage portion 10-2 to a throttle body 18 having therein a suction throttle valve 16 and a third air intaking passage portion 10-3. The throttle body 18 in turn communicates with a surge tank 20, the interior of which communicates with a fourth air intaking passage portion 10-4 formed in a suction manifold 22. The fourth air intaking passage portion 10-4 communicates at its downstream end with a suction or intake port 24 for a combustion chamber 28 of the engine 2 through a suction valve 26. The combustion chamber 28 communicates through an exhaust valve 30 with a first exhaust passage portion 12-1. At the downstream end of the first exhaust passage 12-1 is the exhaust turbine 8 in the charger 4, which in turn communicates with a second exhaust passage portion 12-2.

The engine 2 has on top thereof a blow-by-gas passage 32 which communicates with the first air intaking passage portion 10-1.

The suction manifold 22 has a fuel jet valve 34 mounted therein and pointing toward the suction port 24. Fuel is caused to flow under pressure along a fuel supply line 38 from a fuel tank 40 to the fuel jet valve 34 by the action of a fuel pump 36. There is a fuel line filter 42 mounted partway along the fuel supply line 38. The fuel supply line 38 also communicates halfway therealong with the end of a pressure regulating passage 44 which has its other end submerged in the fuel in fuel tank 40. The pressure regulating passage 44 includes a fuel pressure regulator 46 for regulating the pressure of the fuel supplied to the fuel jet valve 34.

The fuel tank 40 communicates via an evaporating fuel passage 50 which includes a canister 48 with the third air intaking passage portion 10-3 formed at the downstream end of the suction throttle valve 16 in the throttle body 18. There are also a separator 52 and a two-way valve 54 provided in a first evaporating fuel passage portion 50-1 extending between the fuel tank 40 and the canister 48, and a one-way valve 56 is provided in a second evaporating fuel passage portion 50-2 connecting the canister 48 to the third air intaking passage portion 10-3.

The third air intaking passage portion 10-3, at a location upstream of the suction throttle valve 16, communicates with the inside of the surge tank 20 through an idling-up passage 58. The idling-up passage includes first, second and third electric control valves 60-1, 60-2 and 60-3 connected in parallel for increasing the number of idling revolutions when idling-up is needed (for example during start-up, hot ambient conditions, or an increase in electrical load) by supplying extra air, which is accomplished by opening the idling-up passage portions 58-1, 58-2 and/or 58-3.

The third air intaking passage portion 10-3 communicates at a position adjacent the suction throttle valve 16 with an ignition-side pressure introducing passage 68 which leads to a vacuum controller 66 mounted on a distributor 64 of an ignition device 62.

The interior of the surge tank 20 communicates with a detecting pressure introducing passage 72 leading to a pressure sensor 70 which detects a pressure in the air intaking passage.

Figure 3:
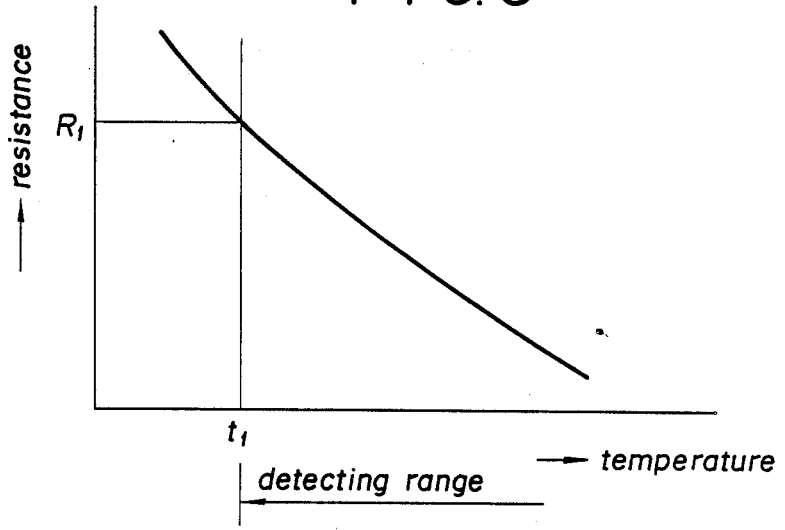

The fourth air intaking passage portion 10-4 in the suction manifold 22 communicates with an EGR passage 76 which in turn communicates with the first exhaust passage portion 12-1 to constitute an EGR mechanism 74. The EGR passage 76 is opened and closed by the action of an EGR valve 78 which is a component of the auxiliary control system for the engine 2 and controls the flow in the EGR passage 76 to the fourth air intaking passage portion 10-4. There is a thermistor 82 mounted adjacent the fourth air intaking passage portion 10-4 on the intake side of the EGR valve 78, in particular on the outer side of an EGR passage wall 80, and it acts as a control sensor for examining whether the EGR operation is accomplished based on the fact that a resistance thereof decreases when the temperature of the EGR passage wall 80 increases. Since the thermistor 82 makes its resistance reading infinite when the temperature is very low, as shown in FIG. 3, the operation of the EGR mechanism 74 with the temperature of the EGR passage wall 80 remaining above a specific temperature t1 can be detected.

The suction manifold 22 has a water temperature sensor 86 for detecting the temperature of cooling water in a cooling water line 84 of the engine, and an intake air temperature sensor 88 for detecting the temperature of intake air passing through the air intaking passage 10.

The suction throttle valve 16 in the throttle body 18 has a throttle sensor 90 for detecting the degree the valve 16 is open.

The fuel jet valve 34, fuel pump 36, first, second and third electric control valves 60-1, 60-2 and 60-3, thermistor 82, water temperature sensor 86, intake air temperature sensor 88, and throttle sensor 90 are all connected to a control circuit 94 which is also connected to an ignition coil 92 and, through a fuse 96 and switch 98, to a battery 100.

Figure 2:
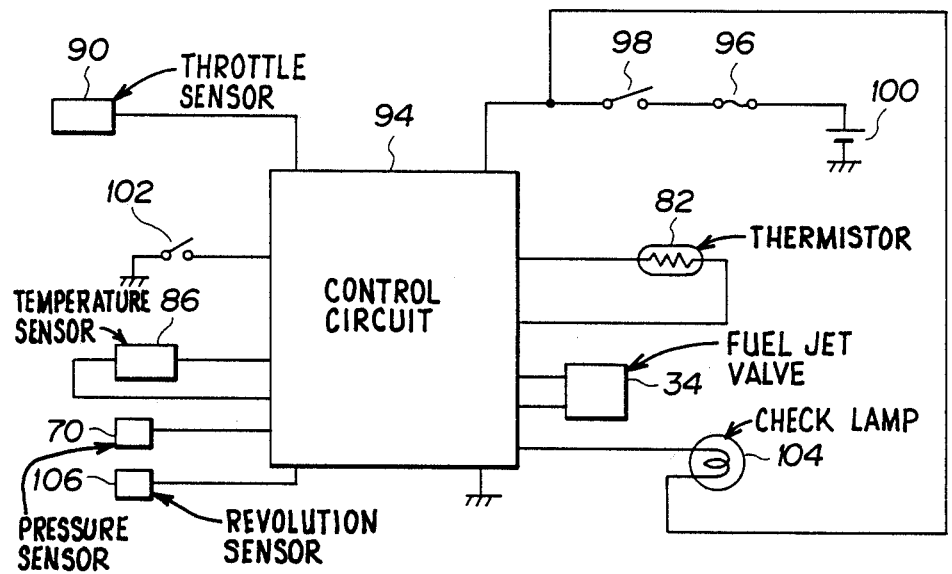

As shown in FIG. 2, the control circuit 94 is also connected to a revolution sensor 106, a check lamp 104 of an indicating arrangement, and a selector switch 102 for selecting one of two programs A and B stored a ROM in the control circuit 94. Program A involves control in which the activation of the EGR mechanism 74 is not involved, and program B involves the activation of the EGR 74. More particularly, the control circuit 94 actuates a controlled arrangement such as the fuel jet valve 34, which is controlled by a particular control program selected from the stored programs, detects the activation or nonactivation of the EGR mechanism 74 using the signal supplied by the thermistor 82, and examines whether the selected control program A or B is supposed to be activating the EGR mechanism 74, as shown in the Table below. If not, the control circuit 94 causes the check lamp 104 to illuminate to thereby provide a visual indication.

TABLE

| Selector Switch | Thermistor | Display |
|---|---|---|
| ON | available (less than R1) | OK |
|  | not available (more than R1) | NG1 |
| OFF | not available (more than R1) | OK |
|  | available (less than R1) | NG2 |

Figure 4:
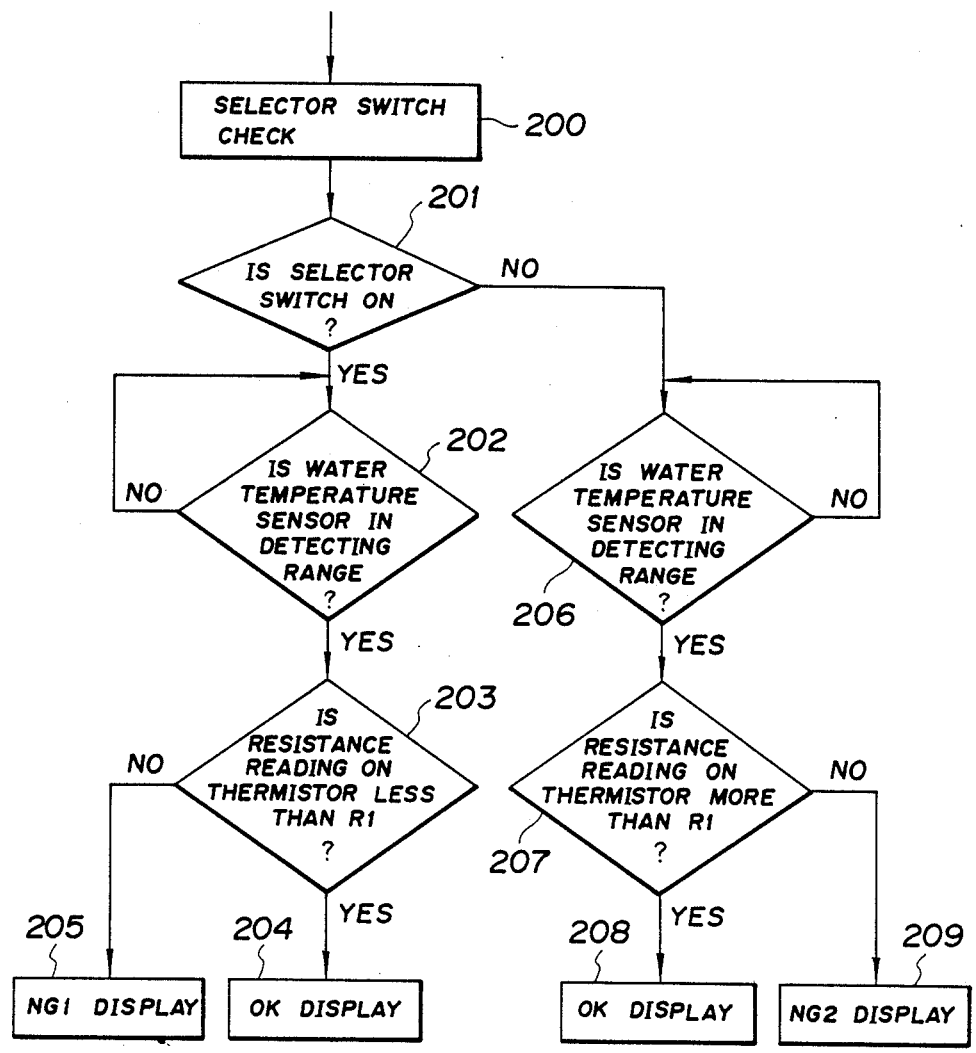

The operation according to the embodiment will now be described in reference with a flow chart shown in FIG. 4.

The selector switch 102 is checked at the step 200, and then it is determined at step 201 whether the selector switch 102 is turned on or not. If the answer is yes at step 201 because the selector switch 102 is on, it is determined at step 202 whether the water temperature sensor 86 is in a detecting range, or in other words indicating that the cooling water has a temperature within a predetermined range. If the answer is no at step 202 because the water temperature sensor 86 is not in the detecting range, the detection at step 202 is repeated. When the water temperature sensor 86 is found to be in the detecting range, it is then determined at step 203 whether the resistance reading of the thermistor 82 is less than the setting R1. More specifically, when the selector switch 102 is on to actuate the EGR mechanism 74, the temperature of the EGR passage wall 80 increases and the resistance on the thermistor 82 decreases to a value less than the setting R1. It is thus determined at step 204, and displayed as OK, that the auxiliary control system for the engine 2 which includes the controlled device is properly activated.

If the answer is no at step 203 because the resistance of the thermistor 82 is more than the setting R1, the control circuit 94 indicates that the thermistor 82 is not energized. Then, it displays NG1 at the next step 205 by causing the check lamp 104 to be lit.

If the answer is no at step 201 because the selector switch 102 is off, meaning the program A which involves no EGR operation is used for actuating the auxiliary control system for the engine 2 which includes the controlled device, it is determined at step 206 whether the water temperature sensor 86 is in the detecting range. If not, step 206 is repeated. If the answer is yes at step 206 because the water temperature sensor 86 is in the detecting range, it is then checked at step 207 whether the resistance reading on the thermistor 82 is more than the setting R1. If the answer is yes at step 207 because the resistance on the thermistor 82 is more than the setting R1, it is determined at step 208, and indicated as OK, that the EGR mechanism is not actuated and that the auxiliary system for the engine 2 including the controlled device is actuated by an appropriate program. If the answer is no at step 207 because the resistance on the thermistor 82 is less than the setting R1, it is determined that the EGR mechanism is actuated and, more particularly, that the selector switch 102 is turned to a wrong position. It then displays NG2 at step 209 by causing the check lamp 104 to be lit.

Accordingly, the control circuit 94 contains the two control programs program A involving no activation of the EGR mechanism 74 and program B involving activation of the EGR mechanism 74, both of which are stored in a ROM thereof and are selectable by the selector switch 102 so that the programs need not be defined by their respective controllers and are thus prevented from being used in an improper manner such as a mismatch or a programming error. The control circuit 94 can be used to execute a selected program from the plurality of programs and can thus be utilized for multiple applications.

Particularly, the mismatch in the EGR mechanism 74 is identified in the embodiment so that the exhaust fumes are prevented from increasing in toxicity.

When the selector switch 102 is shifted due to a disconnection or short-circuit during operation, the control circuit 94 changes to use another control program for controlling the drive of the engine 2. At that time, the display of NG1 or NG2 is made to show a failure which can thus be identified easily and readily.

Although an operational mismatch of the control circuit 94 and the EGR mechanism 74 is detected by a combination of the thermistor 82 and the selector switch 102 in the preferred embodiment, it can be detected by one single controlled arrangement. Additionally, the auxiliary control system is not limited to the EGR mechanism 74, but may be another mechanism using the characteristics of a thermistor.

As set forth above, according to the present invention, the control arrangement examines the state of a checking signal for an auxiliary engine control system to determine whether the auxiliary engine control system, which includes a controlled arrangement controlled by a particular control program selected from several control programs stored therein, is actuated in a manner corresponding to the selected control program. Since the plurality of distinct programs are contained in the single control arrangement, the control arrangement can be utilized for multiple applications and the programs can be prevented from being used in a mismatch.

What is claimed is:

1. An apparatus comprising: an engine having a combustion chamber, having an intake passage and an exhaust passage which each communicate with said combustion chamber, having an exhaust gas recirculation passage communicating at its respective ends with said exhaust passage and said intake passage, and having selectively actuable valve means for respectively permitting and restricting the flow of gases through said recirculation passage when respectively actuated and deactuated; a temperature sensor provided at a location along a path of flow of exhaust gases from said valve means through said recirculation and intake passages to said combustion chamber; and an engine control arrangement which includes control means for controlling said valve means, said control means operating in one of a first operational mode in which said valve is actuated and a second operational mode in which said valve is deactuated, and includes diagnostic means for carrying out a diagnostic test while said control means maintains said valve means continuously in one of said actuated and deactuated states from a start to an end of said diagnostic test, said diagnostic means having an alarm device and carrying out said diagnostic test using a single measured temperature by obtaining from said sensor during said diagnostic test said single measured temperature, by actuating said alarm device when said control means is in said first operation mode and said single measured temperature is below a first constant value and by actuating said alarm device when said control means is in said second operational mode and said single measured temperature is above a second constant value.

2. An apparatus of claim 1, wherein said engine includes a wall portion which defines a portion of said recirculation passage, and wherein said sensor is provided on said wall portion at a location near said intake passage.

3. An apparatus of claim 3, wherein said sensor is thermistor having a resistance which varies in inverse proportion to the temperature of said wall portion.

4. An apparatus of claim 1, wherein said engine is water cooled and includes a water temperature sensor, and wherein said control means is responsive to said water temperature sensor for inhibiting actuation of said alarm device whenever the water temperature detected by said water temperature sensor is below a predetermined value.

5. An apparatus of claim 1, including an external switch coupled to said control means, said control means being responsive to said external switch of operating in said first operational mode when said switch is in a first of open and closed positions and for operating in said second operational mode when said switch is in a second of said open and closed positions.

6. An apparatus of claim 1, wherein said first and second constant values are equal.

7. An apparatus of claim 1, wherein said alarm device produces an operator perceptible alarm.

8. An apparatus of claim 1, wherein said alarm device includes a lamp, said alarm device illuminating said lamp when said alarm device is actuated.

* * * * *

UNITED STATES PATENT AND TRADEMARK OFFICE
CERTIFICATE OF CORRECTION

PATENT NO. : 4,969,104
DATED : November 6, 1990
INVENTOR(S) : Fujiyuki Suzuki et al It is certified that error appears in the above-identified patent and that said Letters Patent is hereby corrected as shown below:

Column 6, line 33; change "operation" to ---operational---.

Column 6, line 44; change "claim 3" to ---claim 2---.

Column 6, line 44; after "is" insert ---a---.

Column 6, line 56; change "of" to ---for---.

Column 6, line 65; change "claim 1" to ---claim 7---.

Signed and Sealed this

Thirtieth Day of June, 1992

Attest:

DOUGLAS B. COMER

*Attesting Officer*      *Acting Commissioner of Patents and Trademarks*